United States Patent
Wu

(10) Patent No.: US 7,172,976 B2
(45) Date of Patent: Feb. 6, 2007

(54) EXTRUSION-FREE WET CLEANING PROCESS FOR COPPER-DUAL DAMASCENE STRUCTURES

(75) Inventor: Chih-Ning Wu, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 570 days.

(21) Appl. No.: 10/707,986

(22) Filed: Jan. 29, 2004

(65) Prior Publication Data

US 2004/0124172 A1    Jul. 1, 2004

Related U.S. Application Data

(63) Continuation of application No. 09/682,054, filed on Jul. 16, 2001, now Pat. No. 6,794,292.

(51) Int. Cl.
*H01I 21/302* (2006.01)
*C09K 13/00* (2006.01)

(52) U.S. Cl. ............... 438/745; 438/754; 216/105; 252/79.1; 252/79.2

(58) Field of Classification Search ............... 438/745, 438/754; 216/105; 252/79.1, 79.2
See application file for complete search history.

(56) References Cited

U.S. PATENT DOCUMENTS

| | | | | |
|---|---|---|---|---|
| 5,009,714 A | * | 4/1991 | Arrington et al. | 134/2 |
| 5,213,622 A | * | 5/1993 | Bohling et al. | 134/3 |
| 6,054,061 A | * | 4/2000 | Bayes et al. | 216/13 |
| 6,143,657 A | * | 11/2000 | Liu et al. | 438/687 |
| 6,794,292 B2 | * | 9/2004 | Wu | 438/700 |

* cited by examiner

*Primary Examiner*—Nadine G. Norton
*Assistant Examiner*—Lynette T. Umez-Eronini
(74) *Attorney, Agent, or Firm*—Winston Hsu

(57) ABSTRACT

An extrusion-free wet cleaning process for post-etch Cu-dual damascene structures is developed. The process includes the following steps: (1). providing a wafer having a silicon substrate and at least one post-etch Cu-dual damascene structure, the post-etch Cu-dual damascene structure having a via structure exposing a portion of a Cu wiring line electrically connected with an $N^+$ diffusion region of the silicon substrate, and a trench structure formed on the via structure; (2). applying a diluted $H_2O_2$ solution on the wafer to slightly oxidize the surface of the exposed Cu wiring line; (3). washing away cupric oxide generated in the oxidation step by means of an acidic cupric oxide cleaning solution containing diluted HF, $NH_4F$ or $NH_2OH$; and (4). providing means for preventing Cu reduction reactions on the Cu wiring line.

10 Claims, 3 Drawing Sheets

EXTRUSION-FREE WET CLEANING PROCESS FOR COPPER-DUAL DAMASCENE STRUCTURES

CROSS REFERENCE TO RELATED APPLICATIONS

This is a continuation application of U.S. patent application Ser. No. 09/682,054 filed Jul. 16, 2001 now U.S. Pat. No. 6,794,292 issued Sep. 21, 2004 by Chih-Ning Wu.

BACKGROUND OF INVENTION

1. Field of the Invention

The present invention relates to an improved wet cleaning approach to back-end of line (BEOL) processes. More particularly, the present invention relates to an improved two-step wet cleaning process incorporated with an extrusion inhibition step for post-etch copper structures, particularly, for copper-dual damascene structures. The two-step wet cleaning process comprises a mild oxidation step followed by an oxide etch step. This approach demonstrates clean copper dual damascene structures having no copper extrusions that arise due to oxidation-reduction ("redox") reactions in a wet cleaning solution abundant in dissolved copper ions.

2. Description of the Prior Art

Aluminum alloys with $SiO_2$ dielectrics have been the materials of choice for interconnect systems since the dawn of the integrated circuit (IC) era. These materials were convenient to process using mature subtractive etch processes for metal line patterning. However, as ICs have relentlessly marched down the path towards smaller geometry in the pursuit of increased speed and integration density, the traditional $Al/SiO_2$ interconnect system has shown itself to be a limiting factor. Cu-dual damascene architectures with low-k dielectrics are thus developing and becoming the norm now in forming interconnects in the BEOL processes.

Although Cu/low-k materials present many benefits from a circuit perspective, they require an entirely new process technology for interconnect fabrication. Fortunately, many of these process issues have been addressed with intermediate interconnect systems employing Cu metal with low-k dielectrics. Some of these low-k materials include FLARE™, SiLK™ and BCB (porous dielectrics). This Cu/low-k material process flow led to the development of Cu dual damascene processes in order to overcome the difficulties presented with reactive ion etching (RIE) of Cu. However, processing with these Cu/low-k material systems presents an entirely new set of problems that must be overcome. Etching vias and trenches results in the formation of complex organometallic polymers, which are difficult to clean using dry processes. Since Cu does not possess the self-passivating properties of Al, the tendency of Cu to corrode when exposed to an oxidizing environment is also a major concern. This is especially problematic with the wet immersion processes required for cleaning Cu/low-k etch residues.

One approach typically used to clean copper structures after via/trench dry etch is using a very diluted aqueous HF-based cleaning process. An alternative approach featuring its effectiveness, which was developed by Mattson Technology Wet Process Division (Exton, Pa.) and United Microelectronics Corp. (Hsinchu, Taiwan), includes a two-step process based on the diluted HF-based cleaning process. The first step of the two-step process is a mild oxidation step consisting of a dilute $H_2O_2$ solution 36:1 and a surfactant with megasonics irradiation. This step removes some polymer residues and the sputtered Cu on the sidewalls of the vias and trenches, and oxidizes the copper surface. The first step can be used without a surfactant. The second step is a mild oxide etch utilizing dilute HF, $NH_4F$ or $NH_2OH$. This step undercuts the polymer residues and removes both leftover sputtered copper from the sidewalls, and oxide, such as $CuO_x$ and $Cu(OH)_2$, from the copper surface.

Referring now to FIG. 1 of a post-etch dual damascene structure 30 formed on a silicon substrate 10, in an acidic ambient, such as HF solution, the lift $CuO_x$ and $Cu(OH)_2$ molecules dissolve and thus produce massive copper ions ($Cu^{2+}$) in the solution (see eq.1). In FIG. 1, after dipping the silicon substrate 10 into an acidic oxide etch solution for a certain time period, a recess 13 formed due to the Cu loss is observed at a top surface of a metal-1 (M-1), i.e. first level metal, Cu wiring line 22 which is electrically connected with a $P^+$ diffusion region 12 of the silicon substrate 10 via a tungsten plug 16. In the meantime, an undesirable extrusion 15 is formed atop an adjacent M-1 Cu wiring line 24 that is electrically connected with a $N^+$ diffusion (electron-rich) region 12 of the silicon substrate 10 via a tungsten plug 18. A reasonable explanation for this phenomenon is that the P-N junction fabricated in the silicon substrate 10 provides an electrical path for electrochemical reactions. Excessive copper ions deposit on the anode (i.e. $N^+$ region connected Cu wiring line) due to reduction reaction (see eq.2). In the reduction of cupric oxide the oxidation number of copper has changed from +2 to zero by the gain of two electrons

SUMMARY OF INVENTION

It is therefore a primary objective of the present invention to provide an improved post-etch dual damascene wet cleaning process to alleviate the above-mentioned extrusion problems.

According to the preferred embodiment, the present invention provides an extrusion-free wet cleaning process for post-etch Cu-dual damascene structures. The process comprises the following steps:

(1). providing a wafer comprising a silicon substrate and at least one post-etch Cu-dual damascene structure, the post-etch Cu-dual damascene structure having a via structure exposing a portion of a Cu wiring line electrically connected with an $N^+$ diffusion region of the silicon substrate, and a trench structure formed on the via structure;

(2). applying a diluted $H_2O_2$ solution on the wafer to slightly oxidize the surface of the exposed Cu wiring line;

(3). washing away cupric oxide generated in the oxidation step by means of an acidic cupric oxide cleaning solution containing diluted HF, $NH_4F$ or $NH_2OH$; and (4). providing means for preventing Cu reduction reactions on the Cu wiring line.

According to one aspect of the present invention, the method of preventing Cu reduction reactions on the Cu wiring line is purging the wafer with inert gas during the wash of wafer by the diluted $H_2O_2$ solution.

According to another aspect of the present invention, the method of preventing Cu reduction reactions on the Cu wiring line is adding a Cu corrosion inhibitor such as benzotriazole (BTA) into the diluted $H_2O_2$ solution.

According to another aspect of the present invention, the method of preventing Cu reduction reactions on the Cu wiring line is reducing the $H_2O_2$ concentration of the diluted $H_2O_2$ solution to below 100:1 (v/v).

According to another aspect of the present invention, the method of preventing Cu reduction reactions on the Cu wiring line is lowering the temperature of the diluted $H_2O_2$ solution during the wash of the wafer to below 15° C.

According to another aspect of the present invention, the method of preventing Cu reduction reactions on the Cu wiring line is increasing the pH of the acidic cupric oxide cleaning solution to above 7.

These and other objectives of the present invention will no doubt become obvious to those of ordinary skill in the art after reading the following detailed description of the preferred embodiment, which is illustrated in the various figures and drawings.

DETAILED DESCRIPTION

Figure 1:
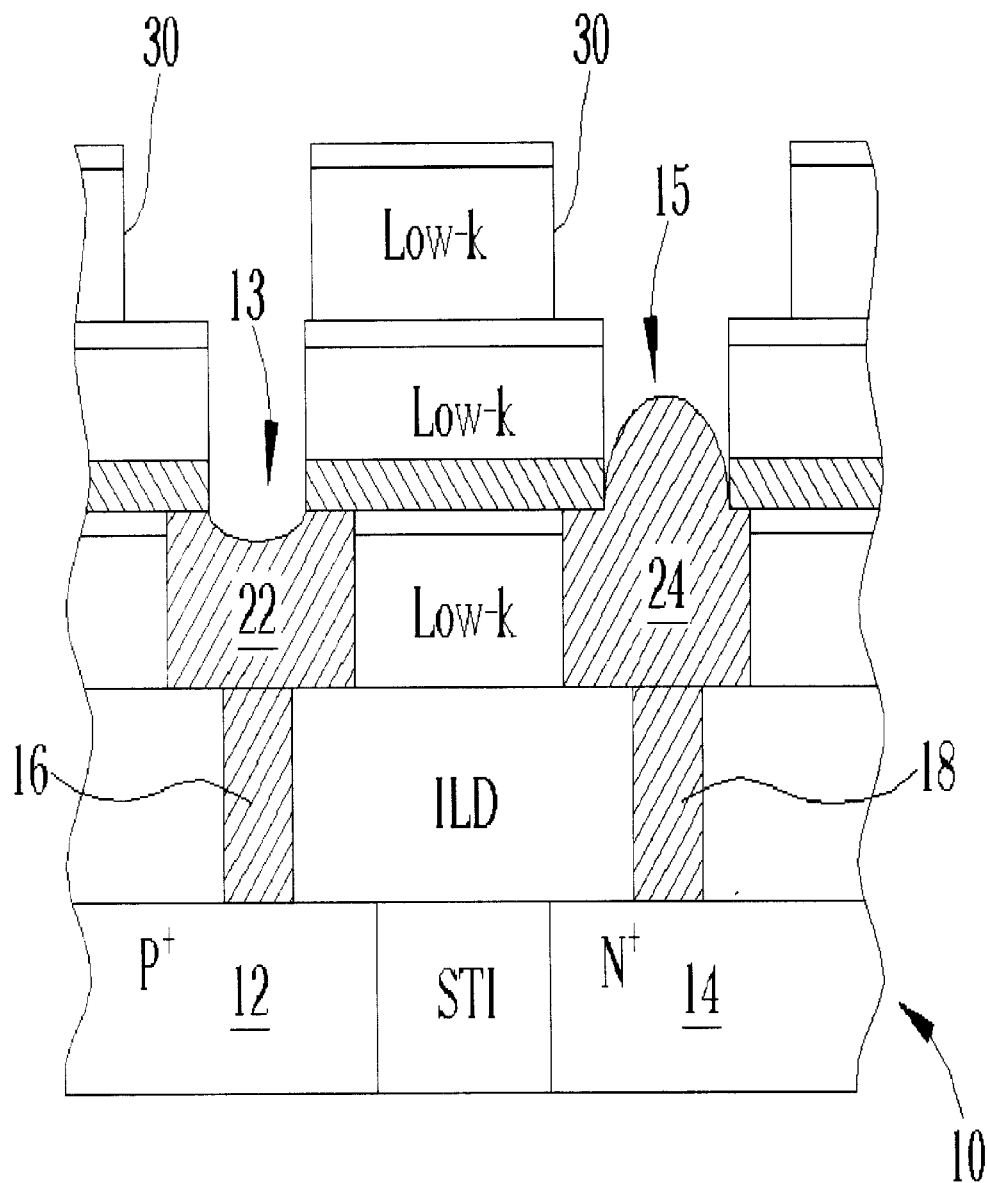
FIG. 1 is a cross-sectional diagram schematically showing a Cu-dual damascene interconnect structure after performing a wet cleaning process according to the prior art.
Figure 2:
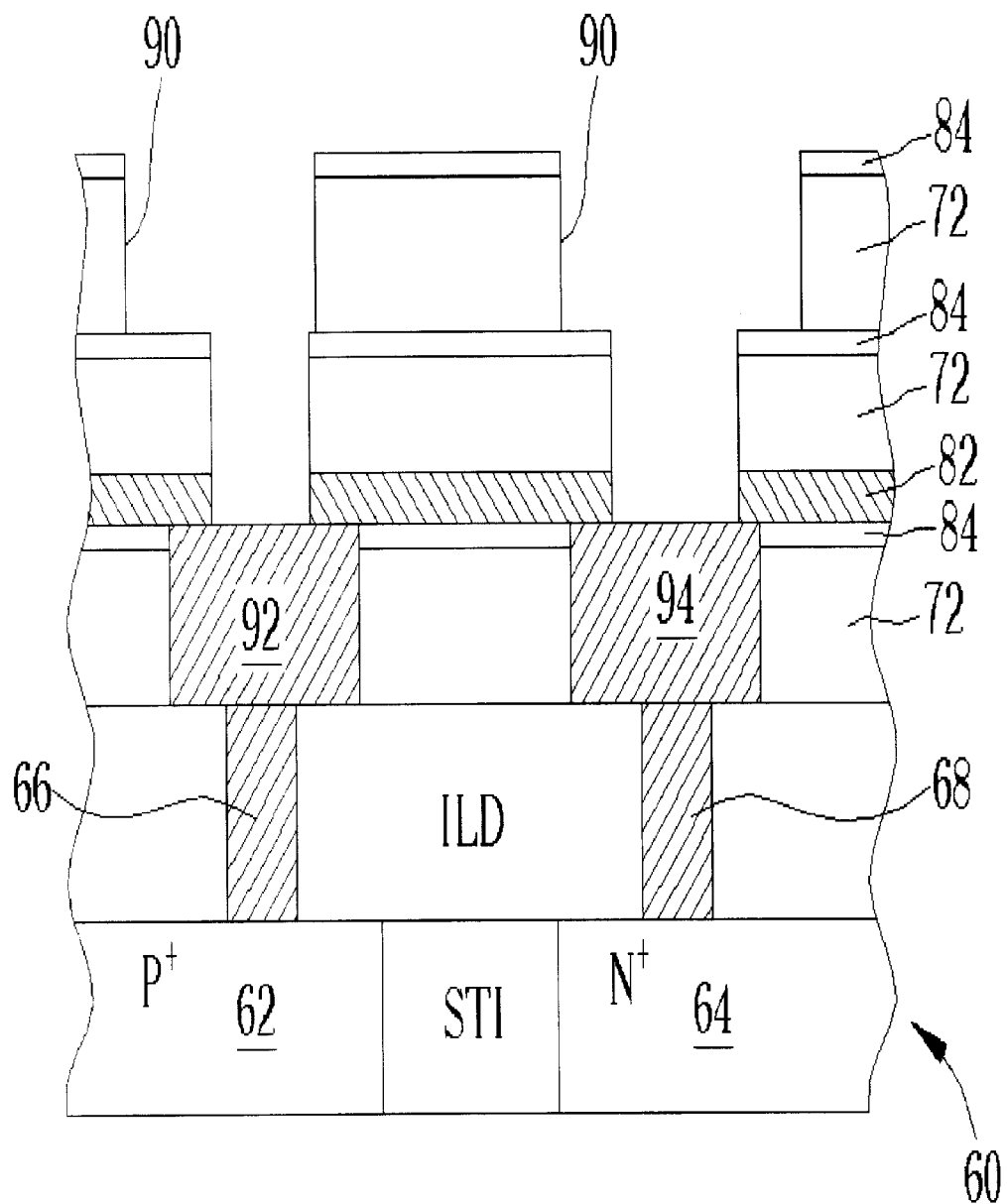
FIG. 2 is schematic dual damascene interconnect structure used to evaluate the efficacy of the improved post-etch cleaning treatments on dual damascene etch residues according to the present invention.

Dual damascene structures 90 used to evaluate the efficacy of improved post-etch cleaning treatments on dual damascene etch residues according to the present invention are now illustrated in FIG. 2. The post-etch dual damascene structures 90 are representative of a dual damascene process flow for a two-level Cu metal system with low-k dielectric layers 72. A wide range of both inorganic and organic low-k (k<3) dielectric materials, produced either by spin-on or CVD processes, are suitable for the present invention. Examples of such inorganic low-k materials include doped oxide: F-doped as FSG; H doped as HSQ; C and H doped as MSQ, HOSP, Black Diamond, Coral and porous silica: aerogels, xerogels and nanoglass. The low-k organic polymers include amorphous fluorocarbon polymers, fluorinated polyimide, PTFE, poly(arylene ether), benzocyclobutene, Silk™ and FLARE™.

As shown in FIG. 2, key features of the dual damascene structures 90 include the use of nitride etch stop layers 82, and oxide hardmasks 84 for patterning the low-k dielectric layers 72. Each dual damascene structure 90, which exposes a portion of the underlying M-1 wiring line 92 and 94, includes a trench, and a via formed beneath the trench. After the etch of the dual damascene structures 90, the via/trench sidewalls show clear evidence of C, O, Si, Cu, and N elemental residues. As mentioned, it is evident that the most problematic cleaning is the M-1 wiring line 94 electrically connected with an $N^+$ region 64 of a silicon substrate 60 via a tungsten plug 68.

To inhibit Cu reduction reactions that occur over the M-1 wiring line 94 and thus resolve the Cu extrusion due to Cu reduction reactions, means for preventing Cu reduction reactions on the Cu wiring line are added to the two-step wet cleaning process. The improved wet process includes the following steps:

(1) oxidation step;
(2) oxide etch step; and
(3) extrusion inhibition step;

wherein the oxidation step is a mild oxidation step consisting of a dilute $H_2O_2$ solution and a surfactant with megasonics irradiation. This step removes some polymer residues and the sputtered Cu on the sidewalls of the vias and trenches, and slightly oxidizes the copper surface. The first step can be used without a surfactant. The second step is a mild oxide etch with an etchant containing dilute HF/HCl, HF, $NH_4F$ or $NH_2OH$. This step undercuts the polymer residues and removes both leftover sputtered copper from the sidewalls and oxide such as $CuO_x$ and $Cu(OH)_2$ from the copper surface, wherein x is 1 or 2. The extrusion inhibition step can be applied during either the oxidation step or the oxide etch step, or, both the oxidation step and the oxide etch step. The goal of the extrusion inhibition step is to prevent cupric ions dissolved in the oxide etch solution from depositing on the exposed surface of the M-1 wiring line 94.

Figure 3:
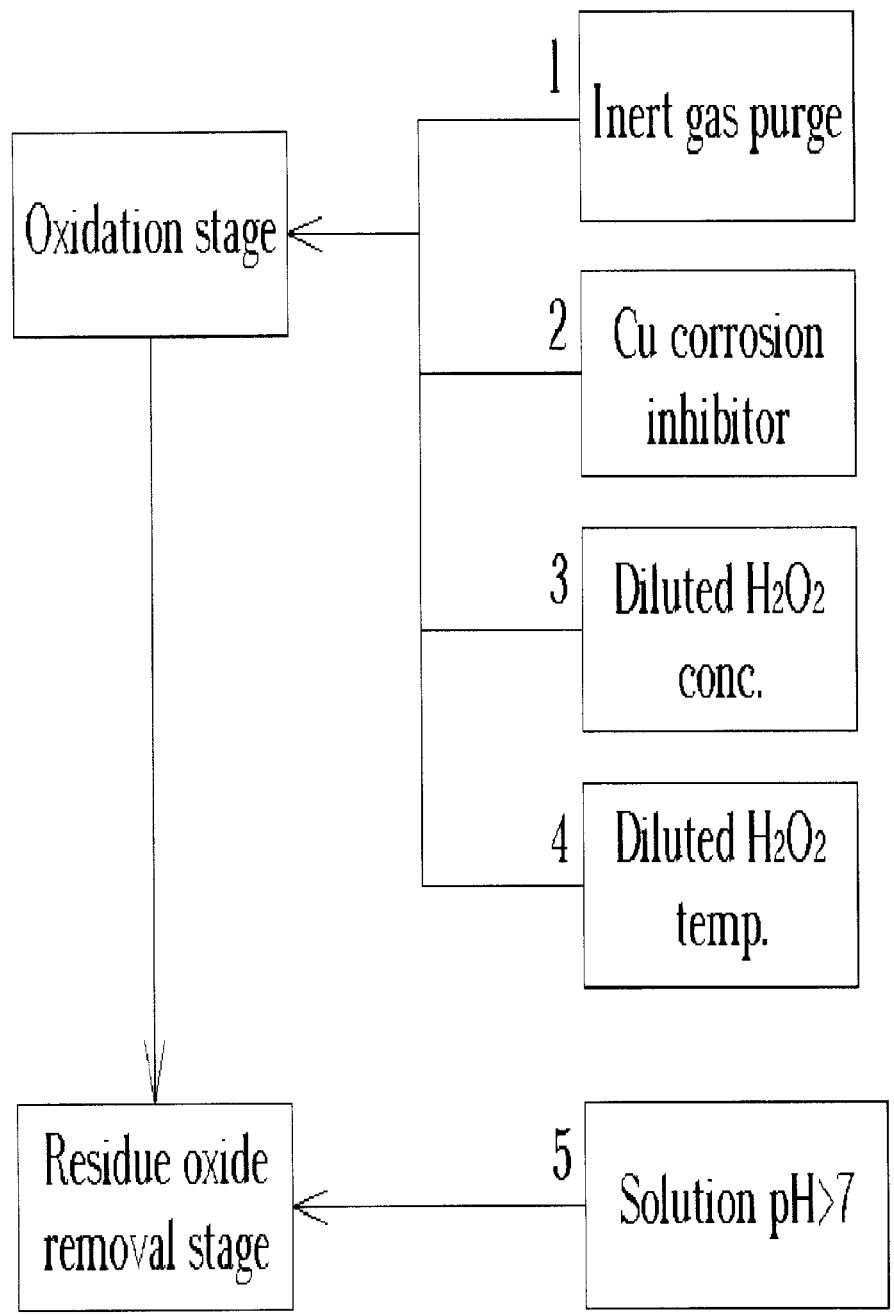
FIG. 3 is a flow chart depicting extrusion inhibition improvement steps according to the present invention.

Please refer to FIG. 3, which is a flow chart depicting the extrusion inhibition improvement steps according to the present invention. As shown in FIG. 3, in a preferred embodiment of the present invention, there are four choices of extrusion inhibition means, which are subject to the oxidation step. They are (1) purging a wafer with inert gas during the wash of the wafer by the diluted $H_2O_2$ solution; (2) adding a Cu corrosion inhibitor such as benzotriazole (BTA) into the diluted $H_2O_2$ solution; (3) reducing the $H_2O_2$ concentration of the diluted $H_2O_2$ solution to below 100:1 (v/v); and (4) lowering the temperature of the diluted $H_2O_2$ solution during the wash of the wafer by the diluted $H_2O_2$ solution to below 15° C. The four choices can be used alone or used by combining two, three, or all of the choices. There is one improvement step in the preferred embodiment for inhibiting Cu reduction reactions on the M-1 wiring line 94. The suggested inhibition step, which is subject to the oxide etch step, is increasing the pH of the acidic cupric oxide cleaning solution to above 7, or using alkaline oxide cleaning solutions known in the art. The inhibition step which is subject to the oxide etch step can be used in combination with the choices being subject to the oxidation step.

Those skilled in the art will readily observe that numerous modifications and alterations of the device may be made while retaining the teachings of the invention. Accordingly, the above disclosure should be construed as limited only by the metes and bounds of the appended claims.

The invention claimed is:

1. A wet cleaning process comprising:
    an oxidation step being performed in combination with a first means for reducing Cu deposition on a cathode-like copper wiring line of a Cu-dual damascene structure, wherein the first means for reducing Cu deposition on a cathode-like copper wiring line comprises a step of purging an inert gas during an oxidation process; and
    an oxide etch step for washing away cupric oxide substances generated in the oxidation step by means of a cupric oxide cleaning solution.

2. The process of claim 1 wherein the oxidation step is used to slightly oxidize a surface of a Cu wiring line in a dual damascene structure by utilizing a diluted $H_2O_2$ solution.

3. The process of claim 1 wherein the cupric oxide cleaning solution comprises diluted HF, $NH_4F$, $NH_2OH$, diluted HF or diluted HCl.

4. The process of claim 1 wherein the cupric oxide substances generated in the oxidation step are $CuO_x$ and $Cu(OH)_2$ wherein x is 1 or 2.

5. The process of claim 1 wherein the cathode-like copper wiring line is electrically connected with an $N^+$ diffusion region of a silicon substrate.

6. The process of claim 2 wherein the first means for reducing Cu deposition on a cathode-like copper wiring line comprises adding a Cu corrosion inhibitor to the diluted $H_2O_2$ solution.

7. The process of claim 6 wherein the Cu corrosion inhibitor comprises benzotriazole (BTA).

8. The process of claim 2 wherein the first means for reducing Cu deposition on a cathode-like copper wiring line comprises reducing the $H_2O_2$ concentration of the diluted $H_2O_2$ solution to below 100:1 (v/v) of solvent to $H_2O_2$.

9. The process of claim 2 wherein the first means for reducing Cu deposition on a cathode-like copper wiring line comprises lowering the temperature of the diluted $H_2O_2$ solution during the oxidation step to below 15° C.

10. The process of claim 1 wherein the oxide etch step for washing away cupric oxide substances generated in the oxidation step is performed in combination with a second means for reducing Cu deposition on a cathode-like copper wiring line, wherein the second means for reducing Cu deposition on a cathode-like copper wiring line comprises increasing the pH of the cupric oxide cleaning solution to above 7.

* * * * *